(12) United States Patent
Wu et al.

(10) Patent No.: US 9,614,421 B2
(45) Date of Patent: Apr. 4, 2017

(54) MOTOR CONTROLLER AND BRUSHLESS DC MOTOR COMPRISING THE SAME

(71) Applicant: Zhongshan Broad-Ocean Motor Co., Ltd., Zhongshan (CN)

(72) Inventors: Yonghua Wu, Zhongshan (CN);
Yunsheng Chen, Zhongshan (CN);
Yong Zhao, Zhongshan (CN);
Chongsheng Zeng, Zhongshan (CN);
Songfa Tang, Zhongshan (CN)

(73) Assignee: Zhongshan Broad-Ocean Motor Co., Ltd., Zhongshan (CN)

( * ) Notice: Subject to any disclaimer, the term of this patent is extended or adjusted under 35 U.S.C. 154(b) by 525 days.

(21) Appl. No.: 14/191,373

(22) Filed: Feb. 26, 2014

(65) Prior Publication Data
US 2014/0175956 A1  Jun. 26, 2014

Related U.S. Application Data

(63) Continuation-in-part of application No. PCT/CN2012/082683, filed on Oct. 10, 2012, and a continuation-in-part of application No. PCT/CN2012/082684, filed on Oct. 10, 2012, and a continuation-in-part of application No. PCT/CN2012/082644, filed on Oct. 9, 2012.

(30) Foreign Application Priority Data

Dec. 29, 2011 (CN) .................... 2011 2 0564259 U
Dec. 29, 2011 (CN) .................... 2011 2 0566281 U
Apr. 28, 2012 (CN) .................... 2012 2 0193192 U

(51) Int. Cl.
*H02K 11/00* (2016.01)
*H02K 5/18* (2006.01)
*H05K 7/20* (2006.01)
*H02K 11/33* (2016.01)

(52) U.S. Cl.
CPC ......... *H02K 11/0073* (2013.01); *H02K 11/33* (2016.01); *H05K 7/209* (2013.01)

(58) Field of Classification Search
CPC . H02K 3/24; H02K 5/00; H01L 25/11; H05K 3/36
USPC .................. 310/64, 68 R, 71; 165/80.3, 185; 361/679.54, 704, 707, 709, 710
See application file for complete search history.

(56) References Cited

U.S. PATENT DOCUMENTS

| | | | |
|---|---|---|---|
| 6,194,856 B1 * | 2/2001 | Kobayashi ............ | H02M 7/003 318/432 |
| 6,195,257 B1 * | 2/2001 | Janicek .................. | H05K 3/366 165/185 |
| 6,704,201 B2 * | 3/2004 | Kasuga .................. | H01L 25/11 165/185 |

FOREIGN PATENT DOCUMENTS

CN  201393115 Y  *  1/2010

* cited by examiner

*Primary Examiner* — Jose Gonzalez Quinones
(74) *Attorney, Agent, or Firm* — Matthias Scholl, PC; Matthias Scholl

(57) ABSTRACT

A motor controller, including: a control box including an inner wall; a circuit board; a dissipater; an IGBT module; and an insulating piece. The circuit board is disposed inside the controller box. The dissipater is disposed on the inner wall of the control box. The IGBT module is disposed on the dissipater and is in electric connection with the circuit board. The insulating piece is disposed between the dissipater and the controller and prevents the dissipater from contacting with the control box.

2 Claims, 14 Drawing Sheets

MOTOR CONTROLLER AND BRUSHLESS DC MOTOR COMPRISING THE SAME

CROSS-REFERENCE TO RELATED APPLICATIONS

This application is a continuation-in-part of International Patent Application No. PCT/CN2012/082683 with an international filing date of Oct. 10, 2012, is also a continuation-in-part of International Patent Application No. PCT/CN2012/082684 with an international filing date of Oct. 10, 2012, and is also a continuation-in-part of International Patent Application No. PCT/CN2012/082644 with an international filing date of Oct. 9, 2012, all designating the United States, all now pending, and further claims foreign priority benefits to Chinese Patent Application No. 201120566281.9 filed Dec. 29, 2011, to Chinese Patent Application No. 201120564259.0 filed Dec. 29, 2011, and to Chinese Patent Application No. 201220193192.9 filed Apr. 28, 2012. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

Field of the Invention

The invention relates to a motor controller and a brushless DC motor comprising the same.

Description of the Related Art

A typical controller for a brushless DC motor includes a control box, a circuit board, a dissipater, and an IGBT (Insulated Gate Bipolar Transistor) module. The circuit board is arranged inside the control box, and the dissipater is arranged on an inner wall of the control box. The IGBT module is disposed on the dissipater and is in electric connection with the circuit board, and the dissipater and the control box directly contact with each other. Such a structure has a potential danger of electrical leakage and a poor insulating effect.

The brushless DC motor includes a housing, a stator assembly, a rotor assembly, a front-end cover, a rear-end cover, a control box, and a circuit board. The stator assembly surrounds the rotor assembly, and the housing and the stator assembly are connected together. The front-end cover and the rear-end cover are disposed on two ends of the housing. The circuit board is disposed inside the control box, the control box is provided with a plurality of mounting holes, and the rear-end cover is provided with a plurality of threaded holes. A screw bar passes through the mounting hole and is inserted into the corresponding threaded hole for fixing the control box on the rear-end cover. A contact position between the mounting hole and the screw bar is sealed by a seal washer. However, when the motor is applied to an outdoor unit of an air-conditioner, the seal washer easily ages, and water easily penetrates into the motor and is difficult to be drained out, which results in short circuit of the motor and poor waterproof and drainage performance

SUMMARY OF THE INVENTION

In view of the above-described problems, it is one objective of the invention to provide a motor controller and a brushless DC motor comprising the same. The motor controller comprises an IGBT module which is isolated safely, thereby effectively solving the problems of potential danger of electrical leakage of the controller and has a good insulating effect. The brushless DC motor of the invention effectively solves problems of water proof and drainage, and also has a simple structure, convenient assembly, and good waterproof and drainage performance.

To achieve the above objective, in accordance with one embodiment of the invention, there is provided a motor controller. The structure comprises: a control box comprising an inner wall; a circuit board; a dissipater; an IGBT module; and an insulating piece. The circuit board is disposed inside the controller box. The dissipater is disposed on the inner wall of the control box. The IGBT module is disposed on the dissipater and is in electric connection with the circuit board. The insulating piece is disposed between the dissipater and the controller and prevents the dissipater from contacting with the control box.

In a class of this embodiment, the dissipater is provided with a mounting hole. An insulting bush is disposed inside the mounting hole. A first screw passes through the control box and the insulating piece and is embedded inside the insulating bush for locking the dissipater.

In a class of this embodiment, the insulating bush comprises two ends. A first end of the insulating bush is provided with a step, and the step is locked on an outer wall of the dissipater. A second end of the insulating bush is embedded in the mounting hole. A mounting groove is disposed inside the insulating bush close to the first end. A first screw is inserted into the mounting groove.

In a class of this embodiment, the insulating bush is formed inside the mounting hole of the dissipater by injection molding.

In a class of this embodiment, the IGBT modules are disposed on two lateral sides of each of the dissipaters and locked by second screws, respectively.

In a class of this embodiment, the circuit board comprises a plurality of unit circuits. The unit circuits comprises: a power circuit, a microprocessor unit, a rotor position detection unit, a power inverter unit, an overcurrent detection unit, and an overvoltage detection unit. The power circuit supplies electric power to each circuit. The overcurrent detection unit, the overvoltage detection unit, and the rotor position detection unit input detection signals to the microprocessor unit. The microprocessor unit sends control signals to the power inverter unit.

In accordance with another embodiment of the invention, there is provided a brushless DC motor, comprising: a housing, the housing comprising two ends; a stator assembly; a rotor assembly; a front-end cover; a rear-end cover, the rear-end cover comprising a plurality of threaded holes and a water channel; the control box, the control box comprising: an inner wall, a plurality of positioning holes, and an end comprising an water outlet; the circuit board; the dissipater; the IGBT module; and the insulating piece. The stator assembly is disposed inside the housing; the rotor assembly is disposed on a bearing of the front-end cover and the rear-end cover and is inserted into the stator assembly. The front-end cover and the rear-end cover are disposed on the two ends of the housing, respectively. The circuit board is arranged inside the control box; the dissipater is disposed on the inner wall of the control box. The IGBT module is disposed on the dissipater and is in electric connection with the circuit board. The positioning holes are disposed on the control box; the threaded holes are disposed on the rear-end cover. A screw bar passes through each positioning hole and is inserted into corresponding threaded hole for fixing the control box on the rear-end cover. The insulating piece is arranged between the dissipater and the control box for preventing the dissipater from directly contacting with the control box. The water channel is arranged on the rear-end cover outside the threaded hole, the water outlet is arranged on the end of the control box, and the water channel communicates with the water outlet.

In a class of this embodiment, a bottom surface of the control box outside the positioning hole is convex downwardly to form a first lug boss. A bottom of the water channel outside the threaded hole is convex to form a second lug boss. The rear-end cover is provided with a wire hole; and the end surface of the rear-end cover outside the wire hole is convex to form a third lug boss.

In a class of this embodiment, a plurality of fourth lug bosses are arranged along a periphery of a top surface of the rear-end cover, a screw hole is disposed in each fourth lug boss; and a division channel is disposed outside the fourth lug boss.

Advantages of the invention are summarized as follows:

1) The arrangement of the insulating piece between the dissipater and the control box prevents the dissipater from directly contacting with the control box. The structure is simple, the potential danger of electrical leakage of the control box is effectively eliminated, and the insulating effect is good.

2) The mounting holes comprising the insulating bush are arranged on the dissipater. The first screw passes the control box and the insulating piece and is inserted into the insulating bush for locking the dissipater. A good insulating property is obtained by using the insulating bush to separate the first screw from the dissipater.

3) The unit circuits are all integrated on the single circuit board. The structure is simple and compact, and the circuits are highly integrated with a low production cost.

4) The water channel disposed on the rear end cover outside the threaded hole communicates with the water outlet disposed on the end of the control box. The water penetrated into the control box via the positioning hole is introduced into the water channel along the screw bar, and drained out of the motor via the water outlet. Meanwhile, the water channel is also capable of preventing the water of the water outlet from entering the control box, thereby solving problems of the waterproof and drainage property of the motor. The structure is simple, the assembly is convenient, and the waterproof and drainage effect are good.

5) The bottom surface of the control box outside the positioning hole is convex downwardly to form the first lug boss. The first lug boss is higher than the circuit board of the control box, thereby ensuring that the water will neither penetrate into the circuit board nor affect the function of the control box. The bottom of the water channel outside the threaded hole is convex to form the second lug boss for preventing the water in the water channel from entering the threaded hole and from affecting the assembly and disassembly of the control box. The rear-end cover is provided with the wire hole; and the end surface of the rear-end cover outside the wire hole is convex to form the third lug boss. The third lug boss is higher than the end surface, so that the water will not enter the motor via the wire hole, thereby avoiding the short circuit of the motor and ensuring the common operation of the motor.

6) The fourth lug bosses are arranged along the periphery of the top surface of the rear-end cover, the screw hole is disposed in each fourth lug boss; and the division channel is disposed outside the fourth lug boss. The fourth lug boss is higher than the spigot. The water is prevented from entering the motor body so that the common operation of the motor is ensured.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a motor controller and a blushless DC motor comprising the same are described below. It should be noted that the following examples are intended to describe and not to limit the invention.

Example 1

Figure 1:
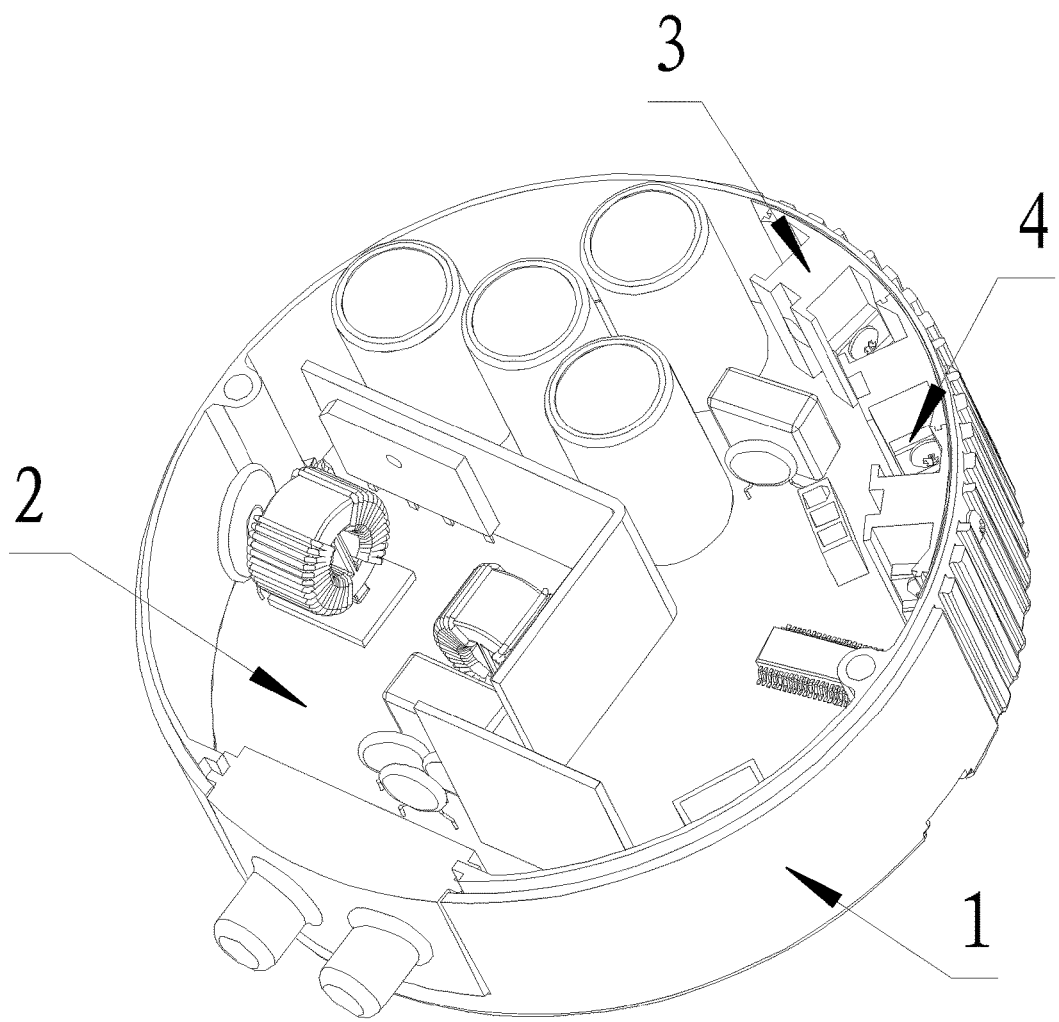
FIG. 1 is a stereogram of a motor controller in accordance with one embodiment of the invention.
Figure 2:
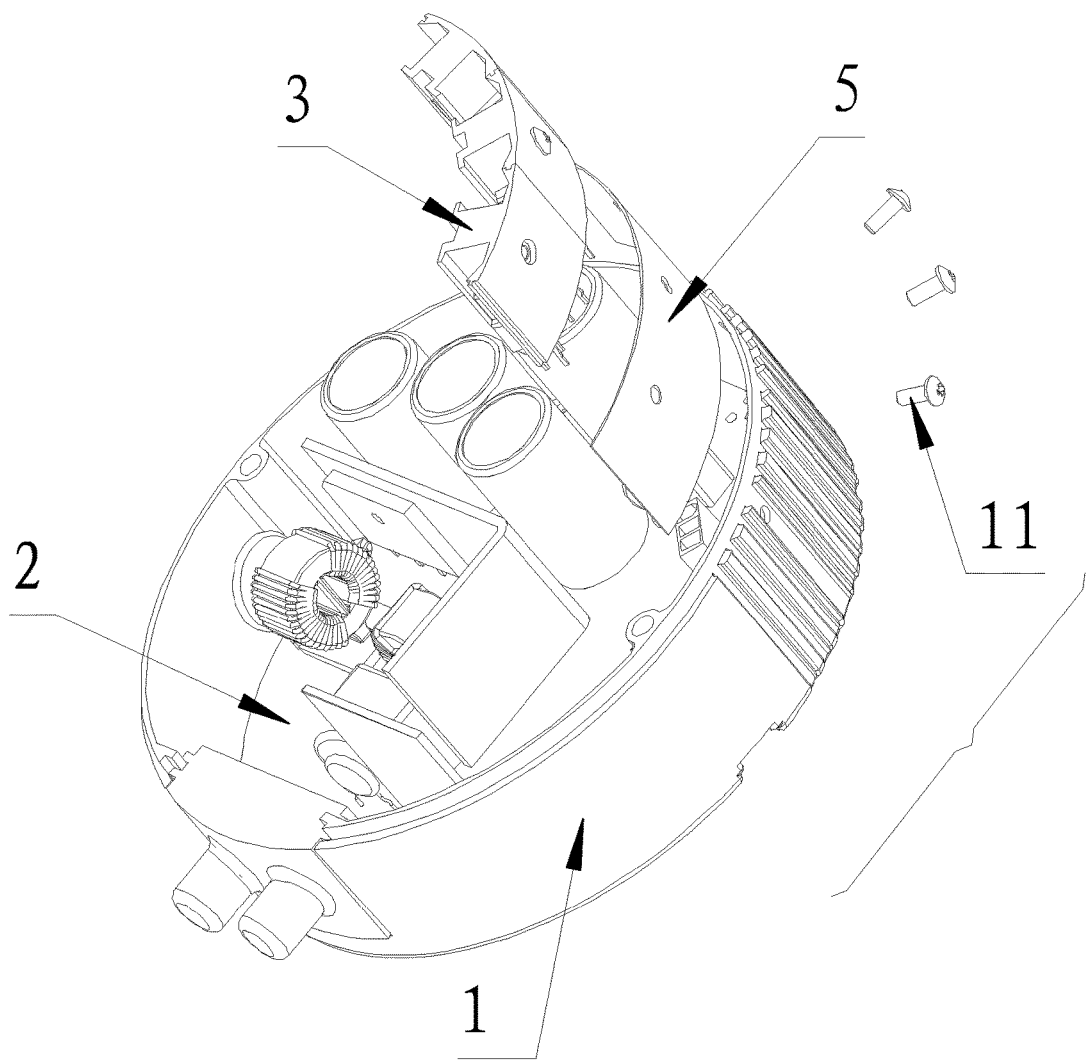
FIG. 2 is an exploded view of a motor controller in accordance with one embodiment of the invention.
Figure 3:
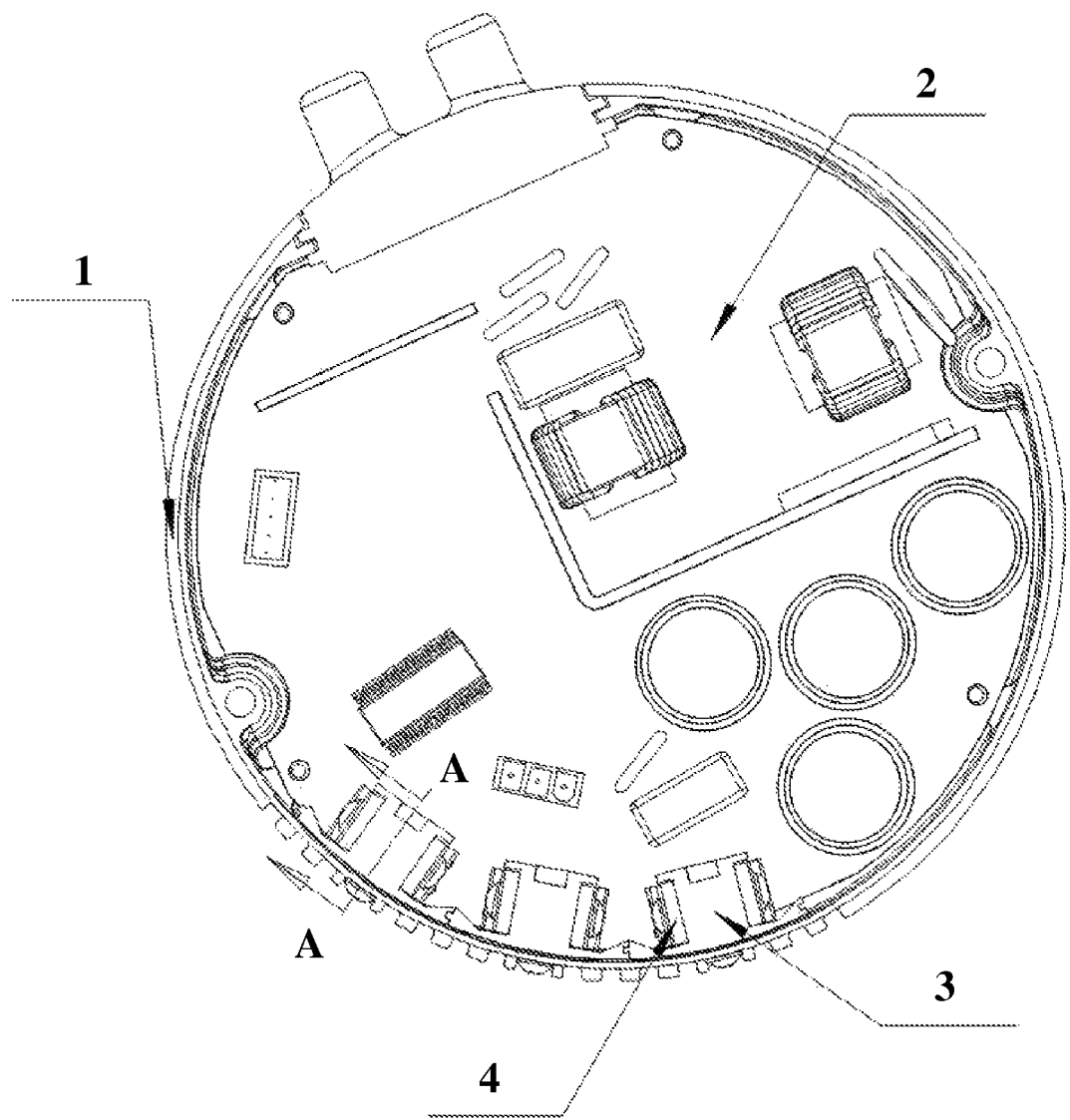
FIG. 3 is a structure diagram of a motor controller in accordance with Example 1.
Figure 4:
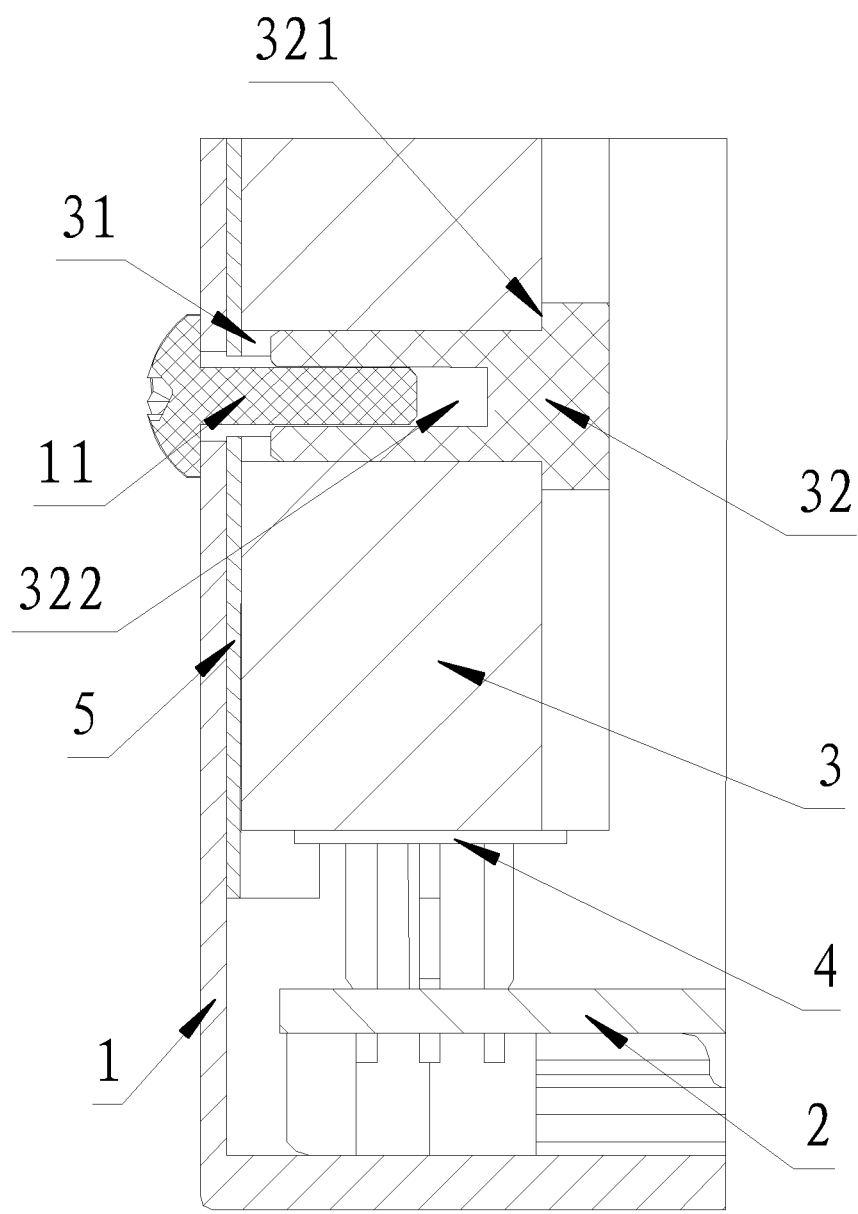
FIG. 4 is a cross-sectional view taken from part A-A of FIG. 3.
Figure 7:
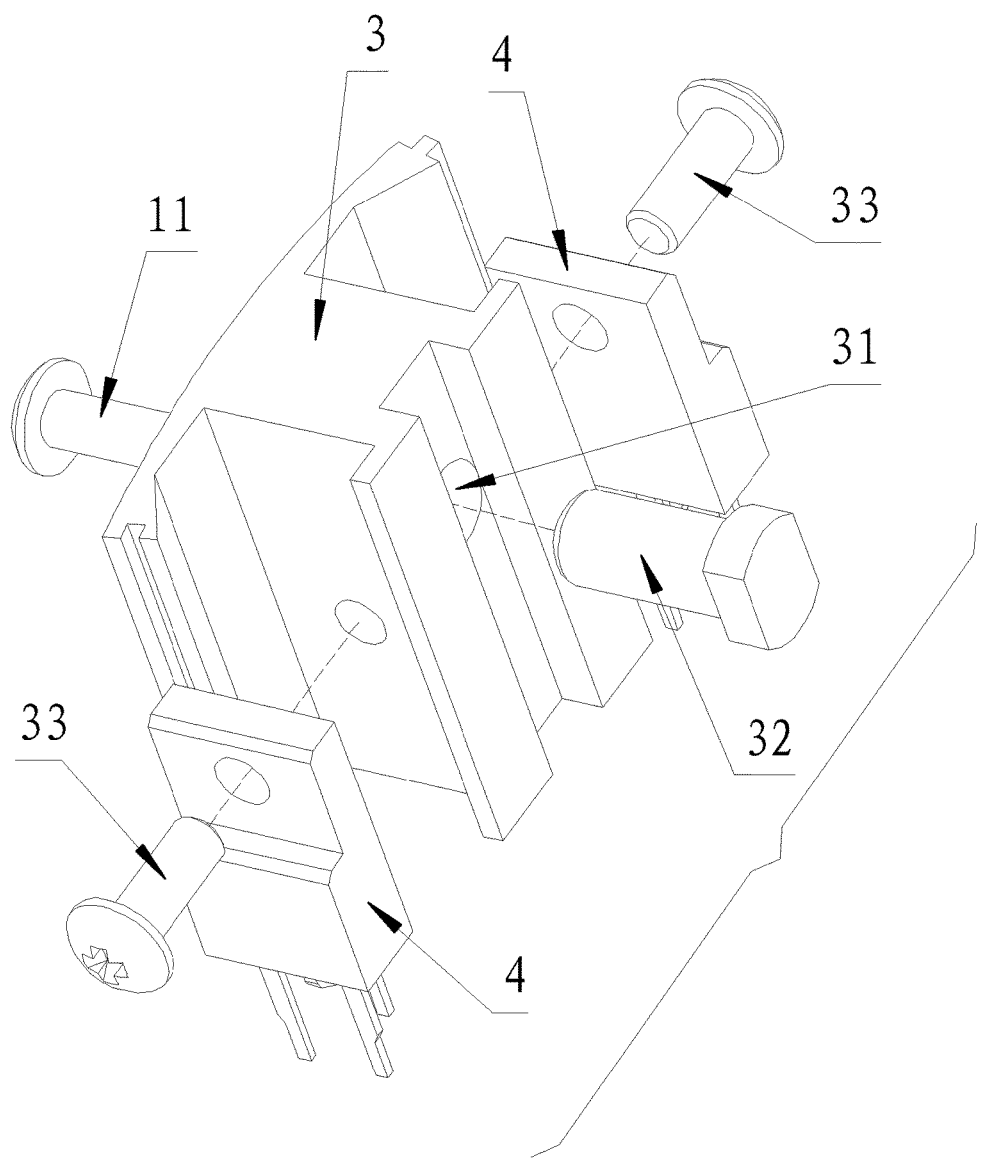
FIG. 7 is an exploded view of a dissipater and a IGBT module in accordance with one embodiment of the invention.
Figure 8:
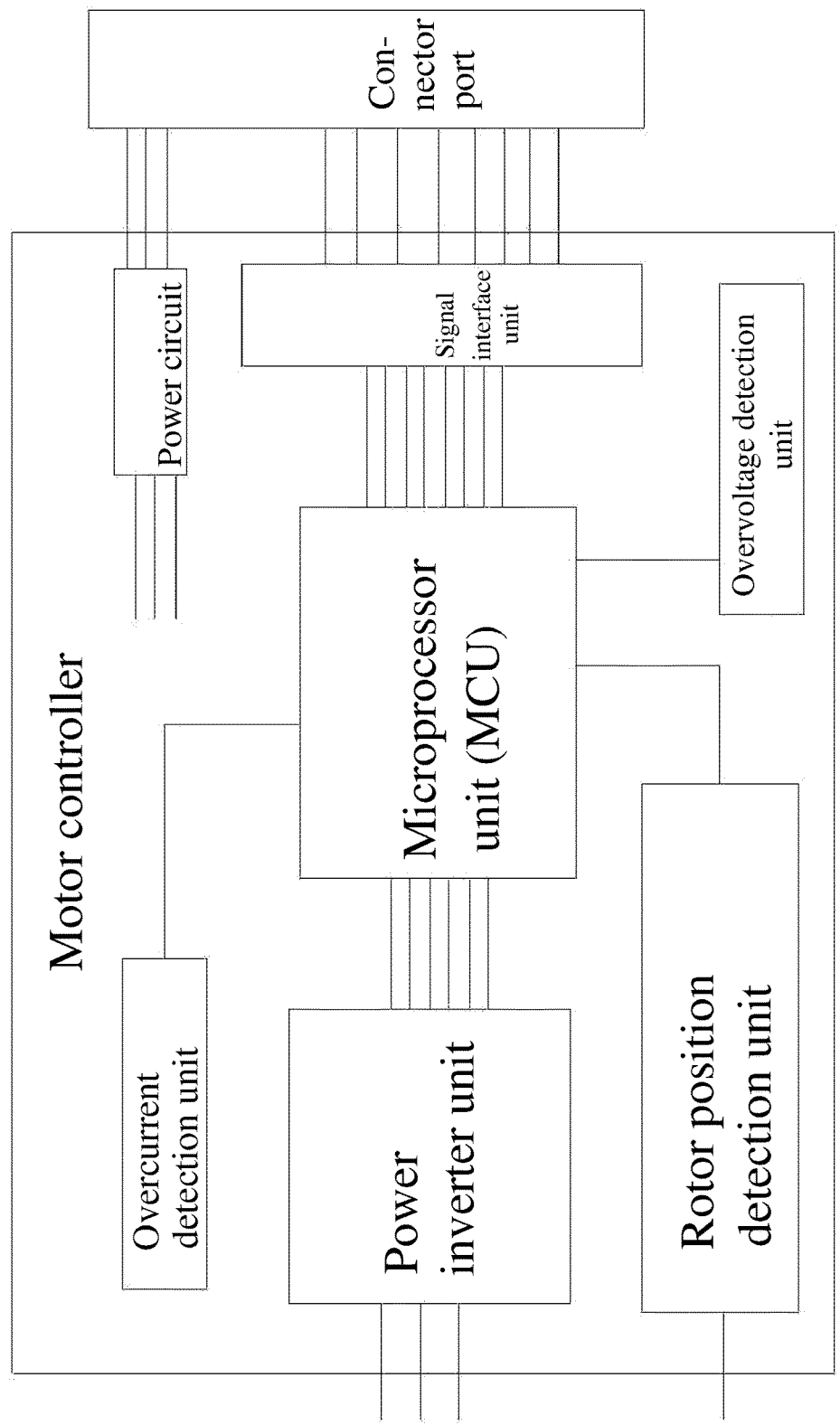
FIG. 8 is a circuit diagram of a motor controller in accordance with one embodiment of the invention.

As shown in FIGS. 1-4 and 7-8, a motor controller, comprises: a control box 1, a circuit board 2, a dissipater 3, and an IGBT module 4. The circuit board 2 is disposed inside the controller box 1, and the dissipater 3 is disposed on an inner wall of the control box 1. The IGBT module 4 is disposed on the dissipater 3 and is in electric connection with the circuit board 2. The insulating piece 5 is disposed between the dissipater 3 and the controller 1 and prevents the dissipater 3 from contacting with the control box 1.

The dissipater 3 is provided with a mounting hole 31. An insulting bush 32 is disposed inside the mounting hole 31. A first screw 11 passes through the control box 1 and the insulating piece 5 and is embedded inside the insulating bush 32 for locking the dissipater 3.

The insulating bush 32 comprises two ends. A first end of the insulating bush 32 is provided with a step 321, and the step 321 is locked on an outer wall of the dissipater 3. A second end of the insulating bush 32 is embedded in the mounting hole 31. A mounting groove 322 is disposed inside the insulating bush 32 close to the first end. A first screw 11 is inserted into the mounting groove 322.

The IGBT modules 4 are disposed on two lateral sides of each of the dissipaters 3 and locked by second screws 33, respectively.

The insulating bush 5 is a silica film.

The dissipater 3 is made of aluminum.

The circuit board 2 comprises a plurality of unit circuits. The unit circuits comprises: a power circuit, a microprocessor unit, a rotor position detection unit, a power inverter unit, an overcurrent detection unit, and an overvoltage detection unit. The power circuit supplies electric power to each circuit. The overcurrent detection unit, the overvoltage detection unit, and the rotor position detection unit input detection signals to the microprocessor unit. The microprocessor unit sends control signals to the power inverter unit.

Principle of the invention is as follows: the insulating piece 1 is arranged between the dissipater 3 and the control box 1 and prevents the dissipater 3 from directly contacting with the control box 1. The mounting holes 31 comprising the insulating bush 32 are arranged on the dissipater 32, the first screw 11 passes the control box 1 and the insulating piece 5 and is inserted into the insulating bush 32 for locking the dissipater 32. The structure is simple, effectively eliminates the potential danger of electrical leakage of the control box, and has a good insulating effect.

Example 2

The motor controller of Example 2 is the same as that in Example 1 except that the insulating bush 32 is formed inside the mounting hole 31 of the dissipater 3 by injection molding.

Figure 5:
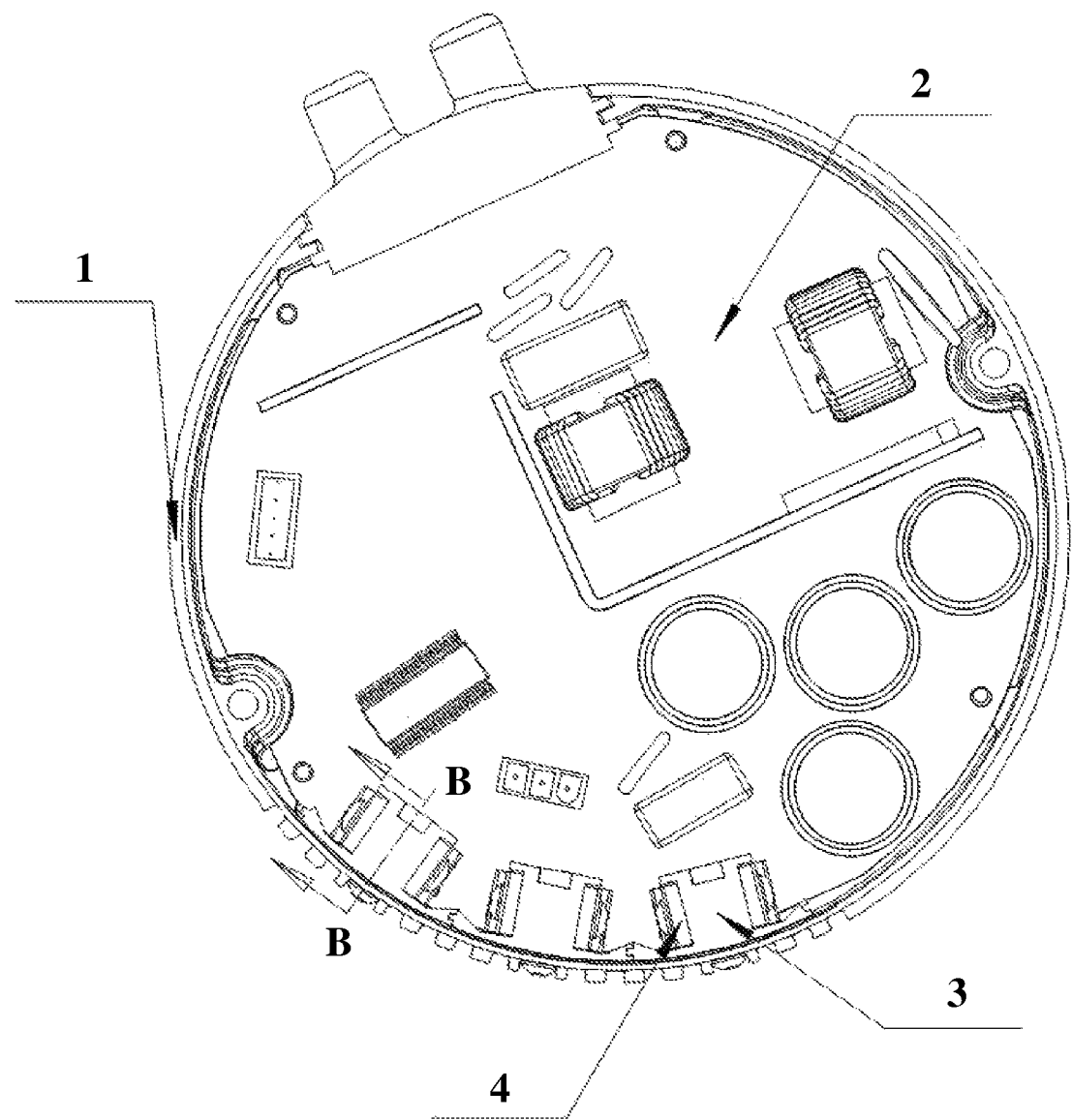
FIG. 5 is a structure diagram of a motor controller in accordance with Example 2.
Figure 6:
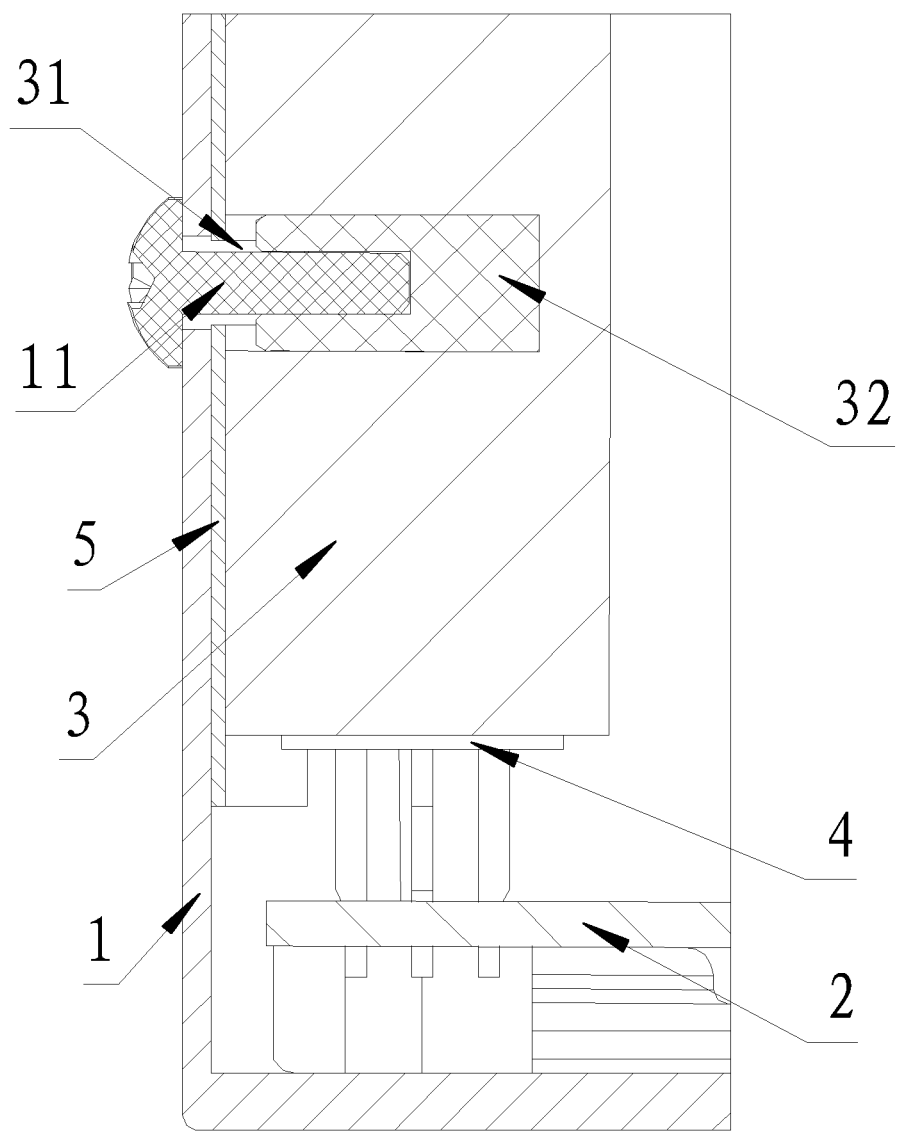
FIG. 6 is a cross-sectional view taken from part B-B of FIG. 5.

As shown in FIGS. 1-2, 5-6, and 8, a motor controller, comprises: a control box 1, a circuit board 2, a dissipater 3, and an IGBT module 4. The circuit board 2 is disposed inside the controller box 1, and the dissipater 3 is disposed on an inner wall of the control box 1. The IGBT module 4 is disposed on the dissipater 3 and is in electric connection with the circuit board 2. The insulating piece 5 is disposed between the dissipater 3 and the controller 1 and prevents the dissipater 3 from contacting with the control box 1.

The dissipater 3 is provided with a mounting hole 31. An insulting bush 32 is disposed inside the mounting hole 31. A first screw 11 passes through the control box 1 and the insulating piece 5 and is embedded inside the insulating bush 32 for locking the dissipater 3.

The insulating bush 32 is disposed on the mounting hole 31 of the dissipater 3 by injection molding.

The IGBT modules 4 are disposed on two lateral sides of the dissipater 3 and locked by the second screws 33.

The insulating bush 5 is a silica film.

The dissipater 3 is made of aluminum.

The circuit board 2 comprises a plurality of unit circuits. The unit circuits comprises: a power circuit, a microprocessor unit, a rotor position detection unit, a power inverter unit, an overcurrent detection unit, and an overvoltage detection unit. The power circuit supplies electric power to each circuit. The overcurrent detection unit, the overvoltage detection unit, and the rotor position detection unit input detection signals to the microprocessor unit. The microprocessor unit sends control signals to the power inverter unit.

Principle of the invention is as follows: the insulating piece 1 is arranged between the dissipater 3 and the control box 1 and prevents the dissipater 3 from directly contacting with the control box 1. The mounting holes 31 comprising the insulating bush 32 are arranged on the dissipater 32, the first screw 11 passes the control box 1 and the insulating piece 5 and is inserted into the insulating bush 32 for locking the dissipater 32. The structure is simple, effectively eliminates the potential danger of electrical leakage of the control box, and has a good insulating effect.

Example 3

Figure 9:
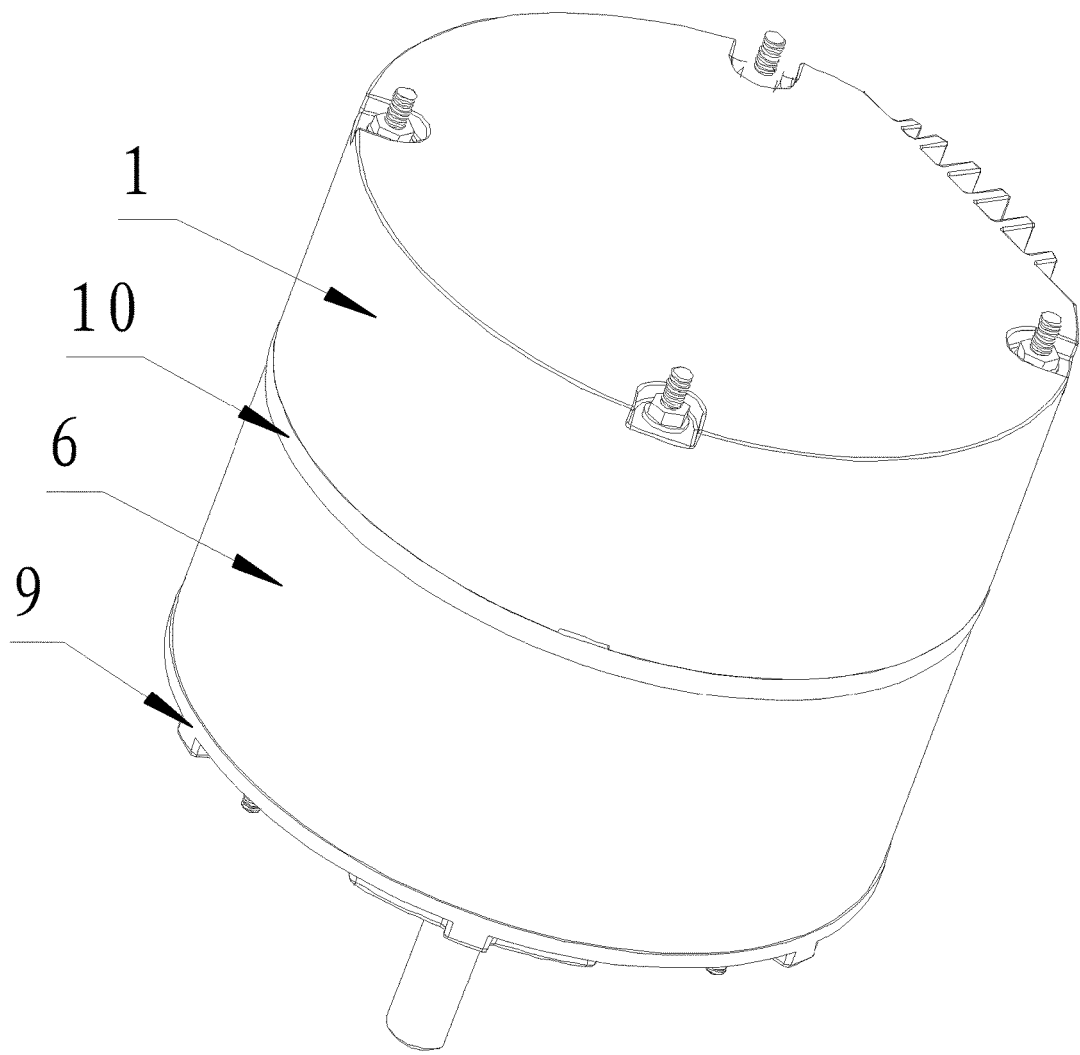
FIG. 9 is a stereogram of a brushless DC motor in accordance with one embodiment of the invention.
Figure 10:
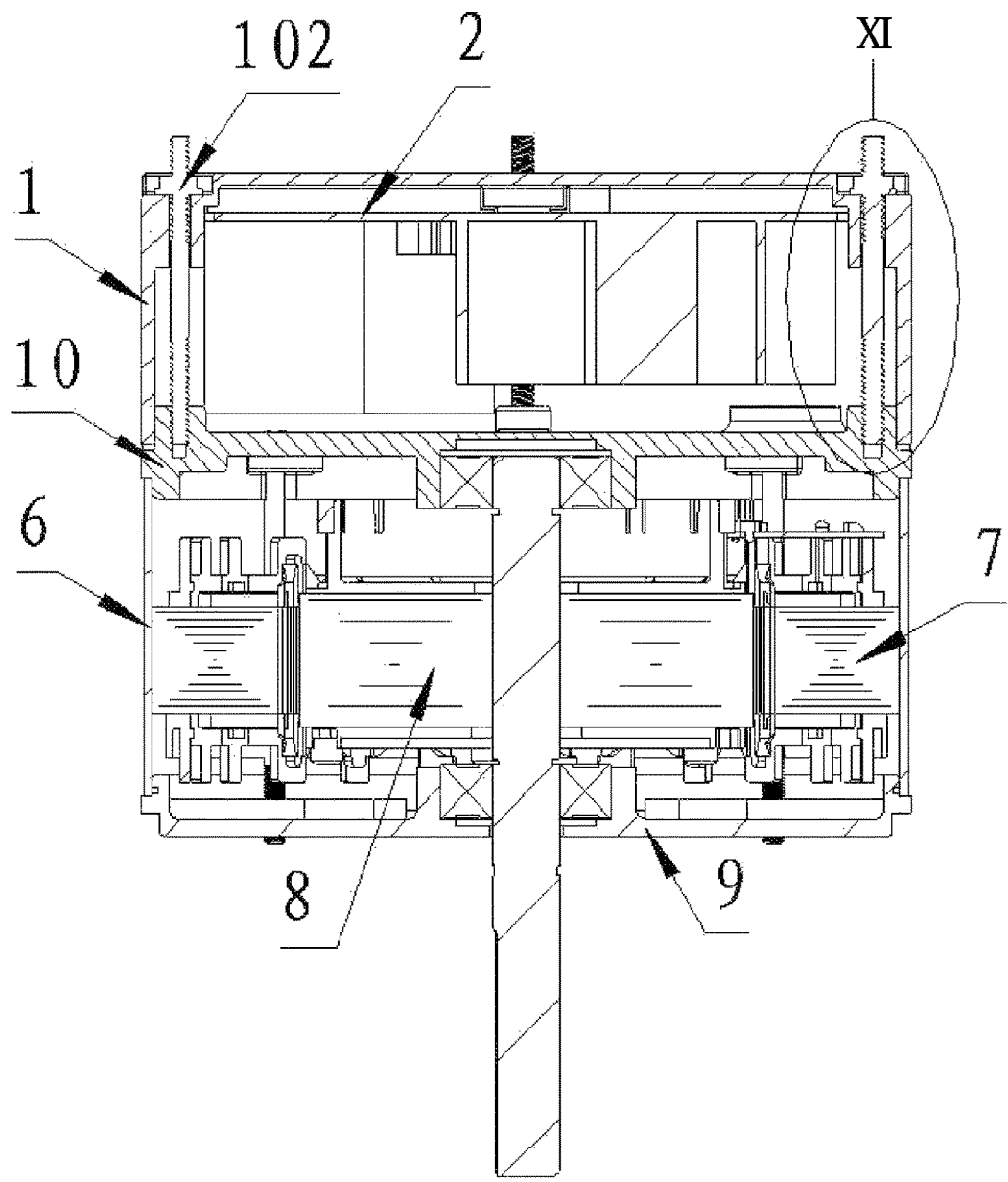
FIG. 10 is a cross-sectional view of a brushless DC motor in accordance with one embodiment of the invention.
Figure 11:
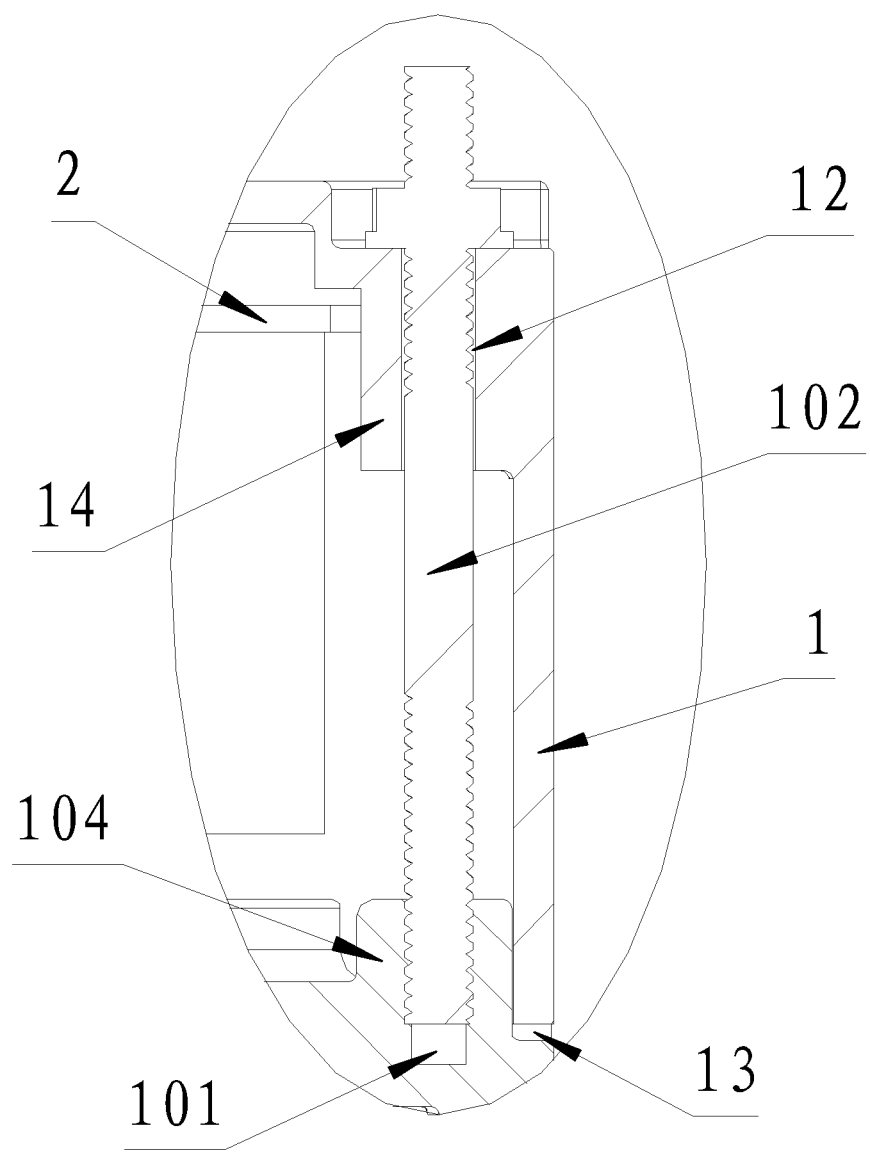
FIG. 11 is an enlarged view of part XI of FIG. 10.
Figure 12:
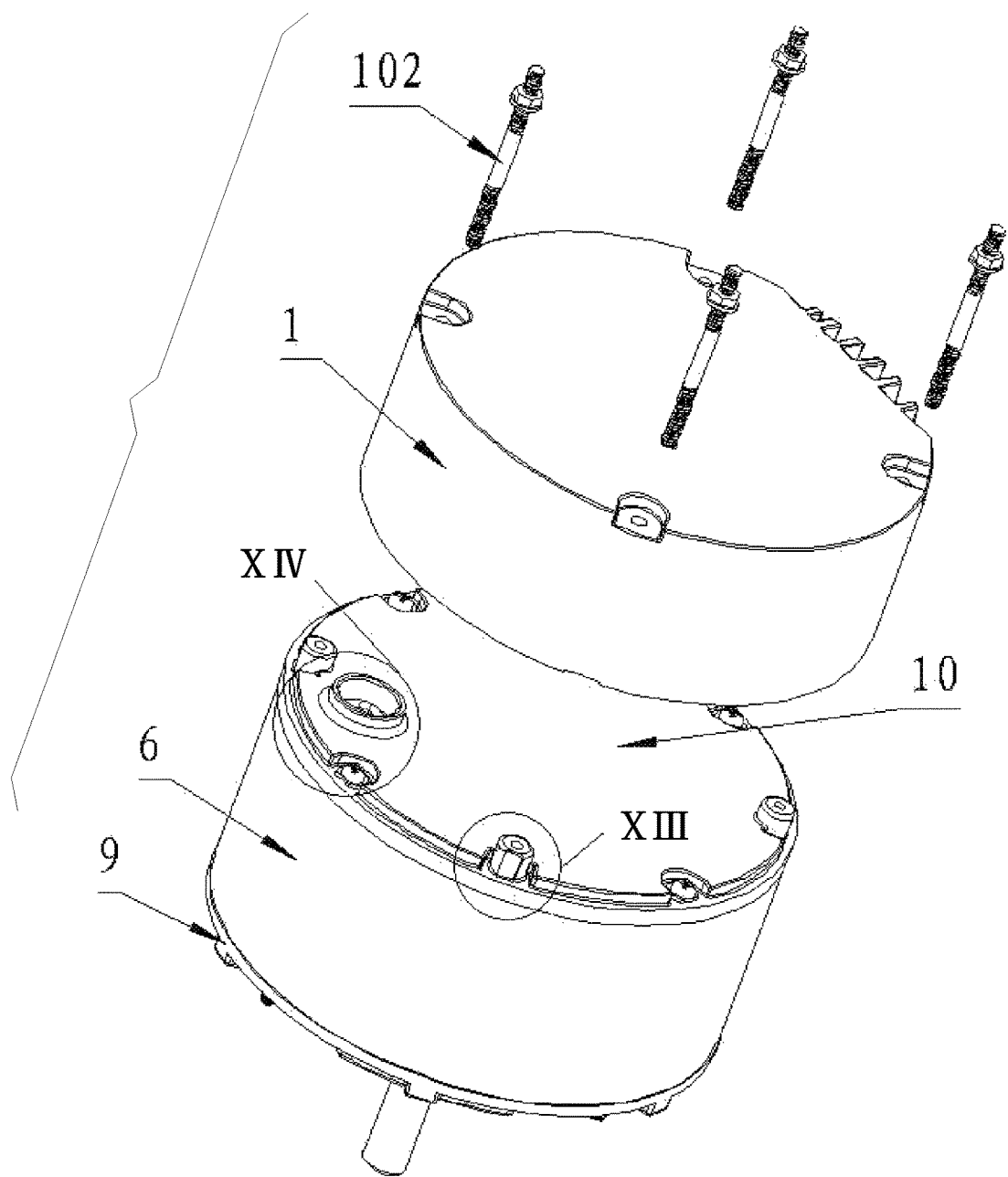
FIG. 12 is an exploded view of a brushless DC motor in accordance with one embodiment of the invention.
Figure 13:
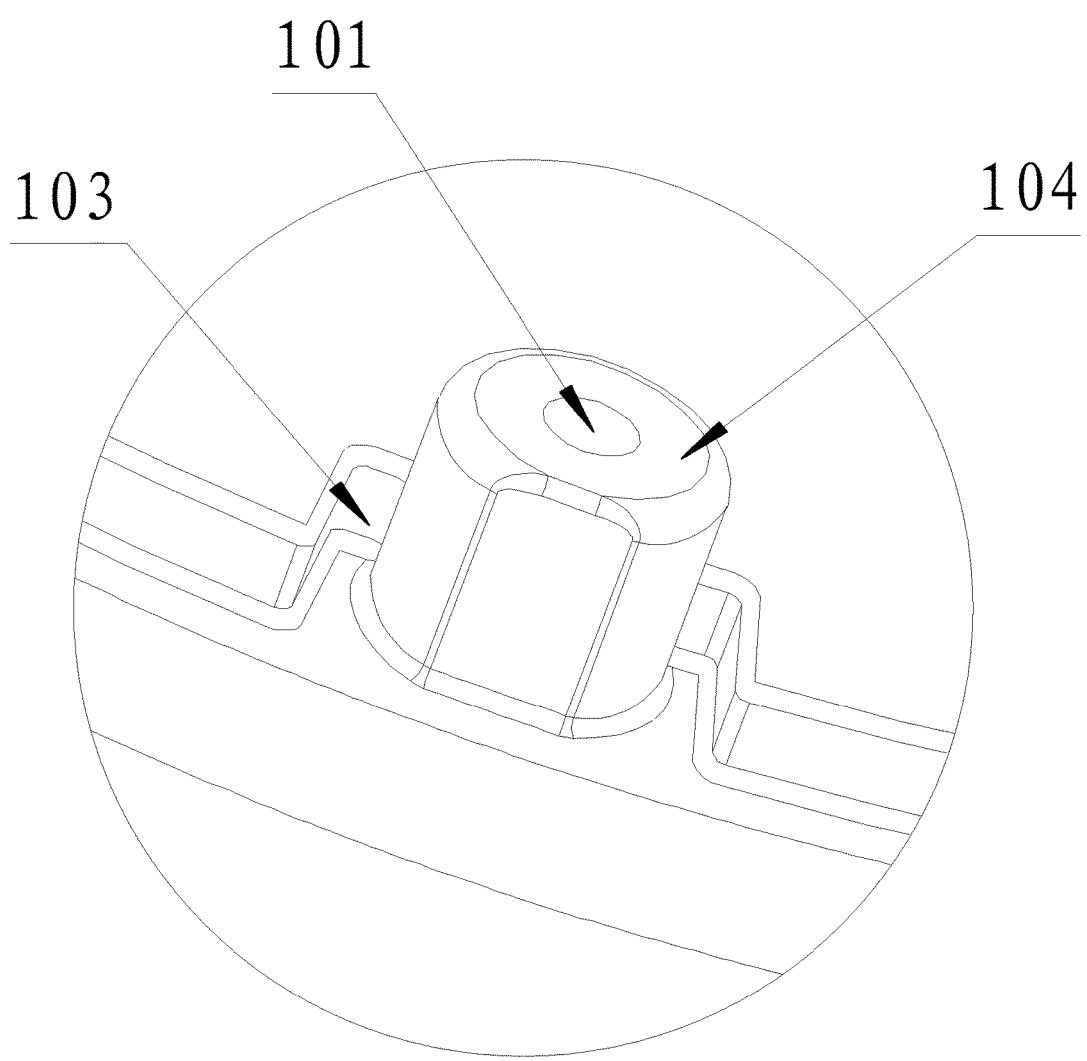
FIG. 13 is an enlarged view of part XIII of FIG. 12.
Figure 14:
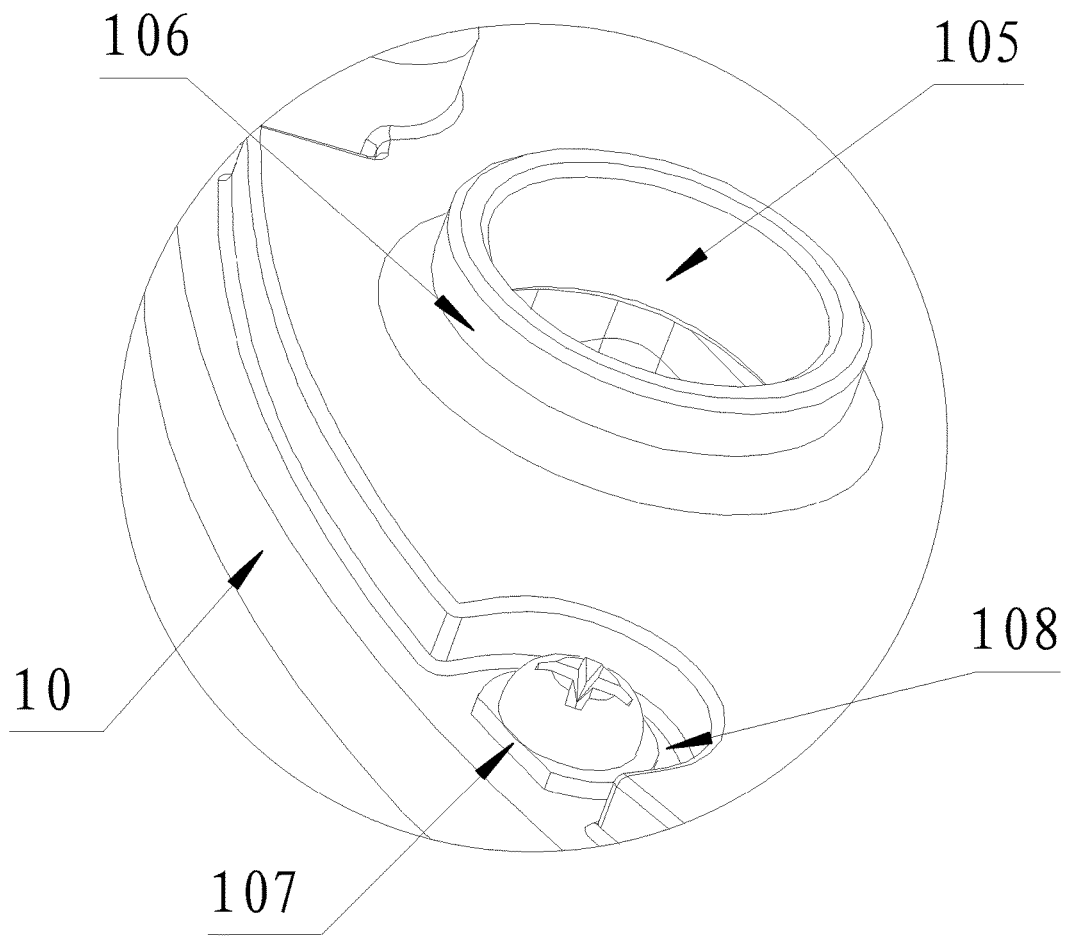
FIG. 14 is an enlarged view of part XIV of FIG. 12.

As shown in FIG. 9-14, a brushless DC motor, comprises: a housing 6, a stator assembly 7, a rotor assembly 8, a front-end cover 9, a rear-end cover 10, a control box 1, a circuit board 2, a dissipater 3, a IGBT module 4, and an insulating piece 5. The stator assembly 7 is disposed inside the housing 6. The rotor assembly 8 is disposed on a bearing of the front-end cover 9 and the rear-end cover 10 and is inserted into the stator assembly 7. The front-end cover 9 and the rear-end cover 10 are disposed on two ends of the housing 6, respectively. The circuit board 2 is arranged inside the control box 1. The dissipater 3 is disposed on the inner wall of the control box 1. The IGBT module 4 is disposed on the dissipater 3 and is in electric connection with the circuit board 2. A plurality of positioning holes 12 are disposed on the control box 1; and a plurality of threaded holes 101 are disposed on the rear-end cover 10. A screw bar 102 passes through each positioning hole 101 and is inserted into corresponding threaded hole 101 for fixing the control box 1 on the rear-end cover 10. The insulating piece 5 is arranged between the dissipater 3 and the control box 1 for preventing the dissipater 3 from directly contacting with the control box 1. A water channel 103 is arranged on the rear-end cover 10 outside the threaded hole 101, a water outlet 13 is arranged on the end of the control box 1, and the water channel 103 communicates with the water outlet 13.

A bottom surface of the control box 1 outside the positioning hole 101 is convex downwardly to form a first lug boss 14. A bottom of the water channel 103 outside the threaded hole 101 is convex to form a second lug boss 104. The rear-end cover is provided with a wire hole 105; and the end surface of the rear-end cover 10 outside the wire hole 105 is convex to form a third lug boss 106.

A plurality of fourth lug bosses 107 are arranged along a periphery of a top surface of the rear-end cover 10, a screw hole is disposed in each fourth lug boss 107; and a division channel 108 is disposed outside the fourth lug boss 107.

Principle of the invention is as follows: the water penetrated into the control box 1 via the positioning hole 12 is introduced into the water channel 103 along the screw bar 102, and drained out of the motor via the water outlet 13. Meanwhile, the water channel is also capable of preventing the water of the water outlet from entering the control box, thereby solving problems of the waterproof and drainage property of the motor. The structure is simple, the assembly is convenient, and the waterproof and drainage effects are good.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A brushless DC motor, comprising:
   a housing, the housing comprising two ends;
   a stator assembly;
   a rotor assembly;
   a front-end cover;
   a rear-end cover, the rear-end cover comprising a plurality of threaded holes and a water channel;

a control box, the control box comprising an inner wall, a plurality of positioning holes, and an end comprising a water outlet;
a circuit board;
a dissipater;
an IGBT module; and
an insulating piece;
wherein:
the circuit board is disposed inside the controller box;
the dissipater is disposed on the inner wall of the control box;
the IGBT module is disposed on the dissipater and is in electric connection with the circuit board;
the insulating piece is disposed between the dissipater and the controller and prevents the dissipater from contacting with the control box;
the stator assembly is disposed inside the housing; the rotor assembly is disposed on a bearing of the front-end cover and the rear-end cover and is inserted into the stator assembly; the front-end cover and the rear-end cover are disposed on the two ends of the housing, respectively;
the circuit board is arranged inside the control box; the dissipater is disposed on the inner wall of the control box; the IGBT module is disposed on the dissipater and is in electric connection with the circuit board;
the positioning holes are disposed on the control box; the threaded holes are disposed on the rear-end cover; a screw bar passes through each positioning hole and is inserted into a corresponding threaded hole for fixing the control box on the rear-end cover;
the insulating piece is arranged between the dissipater and the control box for preventing the dissipater from directly contacting with the control box;
the water channel is arranged on the rear-end cover outside the threaded hole, the water outlet is arranged on the end of the control box, and the water channel communicates with the water outlet;
a bottom surface of the control box outside the positioning hole is convex downwardly to form a first lug boss;
a bottom of the water channel outside the threaded hole is convex to form a second lug boss; and
the rear-end cover is provided with a wire hole, and the end surface of the rear-end cover outside the wire hole is convex to form a third lug boss.

2. A brushless DC motor, comprising:
a housing, the housing comprising two ends;
a stator assembly;
a rotor assembly;
a front-end cover;
a rear-end cover, the rear-end cover comprising a plurality of threaded holes and a water channel;
a control box, the control box comprising an inner wall, a plurality of positioning holes, and an end comprising a water outlet;
a circuit board;
a dissipater;
an IGBT module; and
an insulating piece;
wherein:
the circuit board is disposed inside the controller box;
the dissipater is disposed on the inner wall of the control box;
the IGBT module is disposed on the dissipater and is in electric connection with the circuit board;
the insulating piece is disposed between the dissipater and the controller and prevents the dissipater from contacting with the control box;
the stator assembly is disposed inside the housing; the rotor assembly is disposed on a bearing of the front-end cover and the rear-end cover and is inserted into the stator assembly; the front-end cover and the rear-end cover are disposed on the two ends of the housing, respectively;
the circuit board is arranged inside the control box; the dissipater is disposed on the inner wall of the control box; the IGBT module is disposed on the dissipater and is in electric connection with the circuit board;
the positioning holes are disposed on the control box; the threaded holes are disposed on the rear-end cover; a screw bar passes through each positioning hole and is inserted into a corresponding threaded hole for fixing the control box on the rear-end cover;
the insulating piece is arranged between the dissipater and the control box for preventing the dissipater from directly contacting with the control box;
the water channel is arranged on the rear-end cover outside the threaded hole, the water outlet is arranged on the end of the control box, and the water channel communicates with the water outlet; and
a plurality of fourth lug bosses are arranged along a periphery of a top surface of the rear-end cover, a screw hole is disposed in each fourth lug boss; and a division channel is disposed outside the fourth lug bosses.

* * * * *